United States Patent [19]

Ueda

[11] Patent Number: 5,140,646
[45] Date of Patent: Aug. 18, 1992

[54] PATTERN DETECTOR FOR DETECTING A REFERENCE MARK OR MARKS FORMED ON A PRINTED CIRCUIT BOARD

[75] Inventor: Hidesi Ueda, Yao, Japan

[73] Assignee: Matsushita Electric Industrial Co., Ltd., Osaka, Japan

[21] Appl. No.: 684,390

[22] Filed: Apr. 12, 1991

[30] Foreign Application Priority Data

Apr. 13, 1990 [JP] Japan .................................. 2-96279

[51] Int. Cl.⁵ .............................................. G06K 9/00
[52] U.S. Cl. .................................................... 382/22
[58] Field of Search ................................ 382/10–13, 382/21–22, 24

[56] References Cited

U.S. PATENT DOCUMENTS

| | | | |
|---|---|---|---|
| 4,653,107 | 3/1987 | Shojima et al. | 382/22 |
| 4,783,833 | 11/1988 | Kawabata et al. | 382/22 |
| 4,961,231 | 10/1990 | Nakayama et al. | 382/22 |
| 4,982,342 | 1/1991 | Moribe et al. | 382/21 |
| 5,029,223 | 7/1991 | Fujisaki | 382/24 |

*Primary Examiner*—Stephen Brinich
*Attorney, Agent, or Firm*—Wenderoth, Lind & Ponack

[57] ABSTRACT

An apparatus for automatically mounting chip componenhts on a printed circuit board or the like generally require a pattern detector for detecting a reference mark formed on the circuit board so that the chip components may be properly placed on the circuit board. The pattern detector includes a camera for producing image data from the reference mark and an image processing unit for processing an analog image singal outputted from the camera. The image processing unit includes an A/D converter for converting the image data into digital data in binary form and a central operating portion for detecting contour lines of the reference mark in binary form. The central operating portion calculates angles of tangent lines with respect to the horizontal line at a plurality of locations on the contour lines and further calculates angular changes between two adjoining locations. The central operating portion then compares a row of the angular changes of the reference mark with a row of corresponding angular changes of a reference pattern stored in advance in a reference pattern storage memory. The pattern detector selects those of the row of angular changes of the reference mark that have greatest similarity to the row of angular changes of the reference pattern as being coincident with the reference pattern.

2 Claims, 5 Drawing Sheets

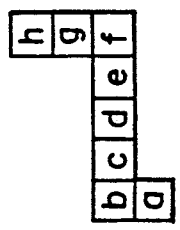
Fig. 5b
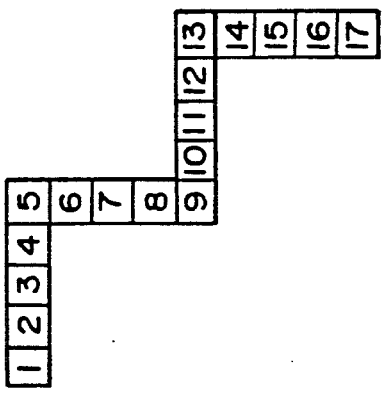
Fig. 5a
Fig. 6

PATTERN DETECTOR FOR DETECTING A REFERENCE MARK OR MARKS FORMED ON A PRINTED CIRCUIT BOARD

BACKGROUND OF THE INVENTION

1. Field of the Invention

The present invention relates to a pattern detector for detecting a reference mark or marks formed, for example, on a printed circuit board. The pattern detector is generally employed in an apparatus for automatically properly mounting chip components such as, for example, semiconductor chips on the circuit board.

2. Description of the Prior Art

Apparatus for automatically mounting chip components on a printed circuit board or the like generally require a pattern detector for detecting a reference mark or marks formed thereon so that the chip components may be properly placed thereon. The reference marks are formed in the proximity of the location where each of the chip components is placed. Proper placement of the chip components is achieved upon detection of the posture or inclination of each of the reference marks. In conventional pattern detectors, the reference marks are detected by a template matching method using a binary template.

FIG. 1 depicts a block diagram of a conventional pattern detector employing the template matching method. The pattern detector of FIG. 1 comprises a camera 2 for conducting image pick-up with respect to a reference mark formed on a circuit board 1, an analog-to-digital conversion circuit 3 for converting an analog image signal to a digital signal, a degree-of-coincidence calculation circuit 4 for calculating the degree of coincidence, a reference template storage memory 5 for storing a reference template, a degree-of-coincidence storage memory 6 for storing the degree of coincidence, and a central operating portion 7.

In the above-described pattern detector, image pick-up is initially conducted by the camera 2 with respect to the reference mark formed on the circuit board 1. The general location of the reference mark is inputted in advance into the pattern detector. The camera 2 outputs an analog image signal to the analog-to-digital conversion circuit 3, which converts the analog image signal outputted from the camera 2 into image data in binary form. The image data are then inputted into the degree-of-coincidence calculation circuit 4, in which the inputted binary image data are compared pixel by pixel with reference template data stored in advance in the reference template storage memory 5. The degree-of-coincidence storage memory 6 stores the total number of pixels in coincidence with those of the reference template data, and the central operating portion 7 refers to the contents of the degree-of-coincidence storage memory 6 so that those of the image data that are the highest in the degree of coincidence may be detected as a pattern in coincidence with the reference pattern.

FIGS. 2a and 2b indicate how to calculate the degree of coincidence in the degree-of-coincidence calculation circuit 4.

As shown in FIG. 2a, binary image data 8 outputted from the analog-to-digital conversion circuit 3 are formulated into a set of two-dimensional data 11 of four bits by a shift register 9 and one-line delay circuits 10.

FIG. 2b depicts reference template data 12 stored in advance in the reference template storage memory 5. The template data 12 are compared pixel by pixel with the two-dimensional data 11 on the same coordinates, and the total number of coincidental pixels is defined as the degree of coincidence. The degree of coincidence shown in FIG. 2b is thirteen.

In the conventional pattern detector having the above-described construction, however, the pattern detection is difficult when a target pattern to be detected rotates or inclines with respect to the reference pattern.

Furthermore, if the reference pattern is large, the time period required for processings becomes long because a large reference pattern has a great number of pixels to be processed. Accordingly, the large reference pattern is not practical.

SUMMARY OF THE INVENTION

The present invention has been developed to overcome the above-described disadvantages.

It is accordingly an object of the present invention to provide a pattern detector which is capable of reliably detecting a pattern formed on an object to be detected even if the object is rotated or inclined.

Another object of the present invention is to provide a pattern detector of the above-described type which is capable of reducing the capacity of a memory for storing data of a reference pattern, with which the pattern formed on the object is compared.

In accomplishing these and other objects, the pattern detector according to the present invention includes; an image pick-up means for producing image data from the reference mark, a means for converting the image data into digital data in binary form a means for detecting contour lines of the reference mark in binary form a means for calculating angles of tangent lines with respect to the horizontal line at a plurality of locations on the contour lines, and a means for calculating angular changes between the angles of the tangent lines at two adjoining locations. The pattern detector further includes a means for comparing a row of the angular changes of the reference mark with a row of corresponding angular changes of the reference pattern.

In the pattern detector having the above-described construction, that portion of the row of angular changes of the reference mark that has greatest similarity to the row of angular changes of the reference pattern is selected as being coincident with the reference pattern.

In the pattern detector according to the present invention, the reference mark to be detected is initially converted into binary image data, from which contour lines of the reference mark are detected. The two-dimensional binary image data are then converted into one-dimensional linear image data. On the basis of the linear image data, a row of angular changes are obtained upon calculation of angles of tangent lines of the contour lines with respect to the horizontal line at a plurality of locations thereof. The row of such angular changes are regarded as pattern data of the reference mark. Those of the pattern data of the reference mark that have the highest degree of coincidence with the pattern data of the reference pattern stored in advance are selected as being coincident with the reference pattern.

The above processings facilitate pattern detection even though the reference mark is rotated or inclined. Furthermore, since the two-dimensional image data are converted into the one-dimensional linear image data, a data memory for storing data of the reference pattern can be reduced in size, thereby enabling comparison between a reference mark and a reference pattern even though they are both large in configuration.

BRIEF DESCRIPTION OF THE DRAWINGS

These and other objects and features of the present invention will become more apparent from the following description taken in conjunction with the preferred embodiment thereof with reference to the accompanying drawings, throughout which like parts are designated by like reference numerals, and wherein:

FIGS. 5a and 5b are schematic views of a contour image of a reference mark to be detected and that of a reference pattern, respectively; and FIG. 6 is a diagram indicative of how to calculate the degree of coincidence of the reference mark with respect to the reference pattern.

DETAILED DESCRIPTION OF THE PREFERRED EMBODIMENTS

Figure 1:
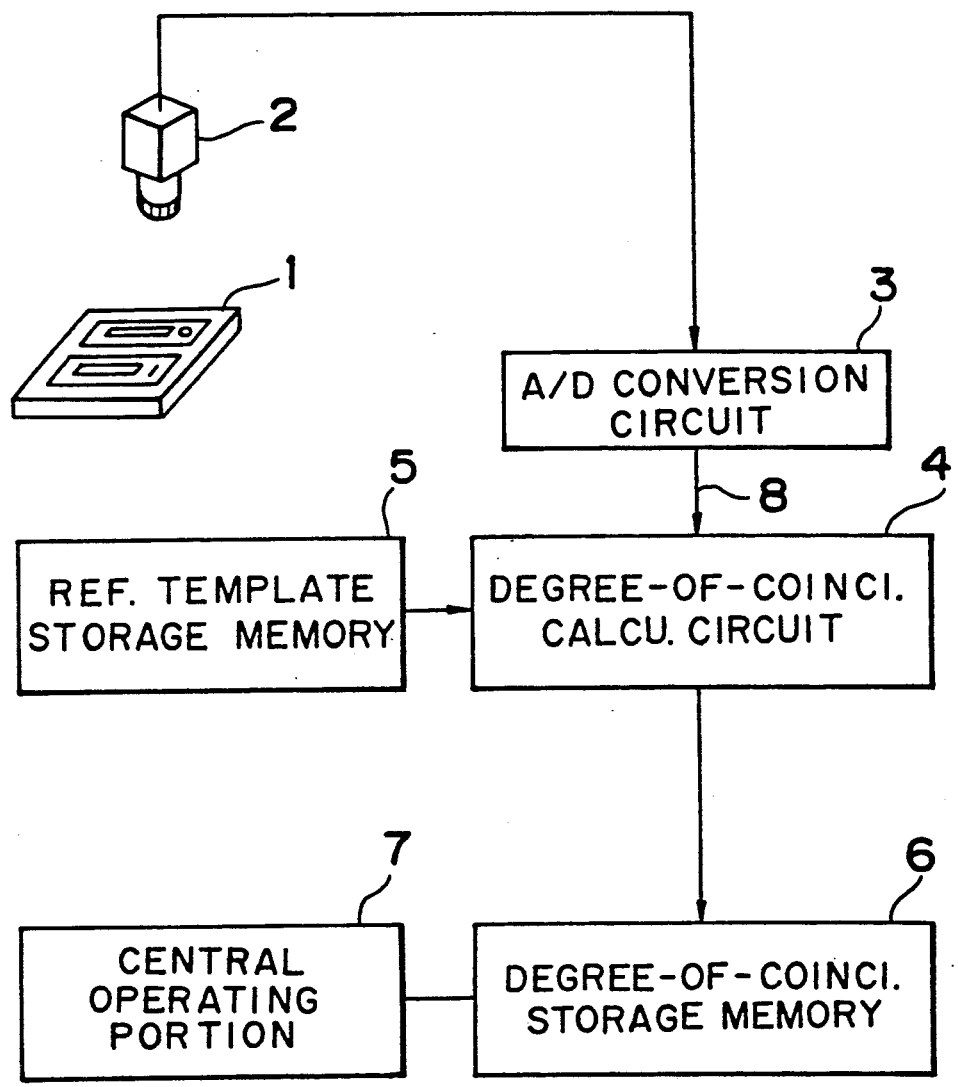
FIG. 1 is a block diagram of a conventional pattern detector.
Figure 2A:
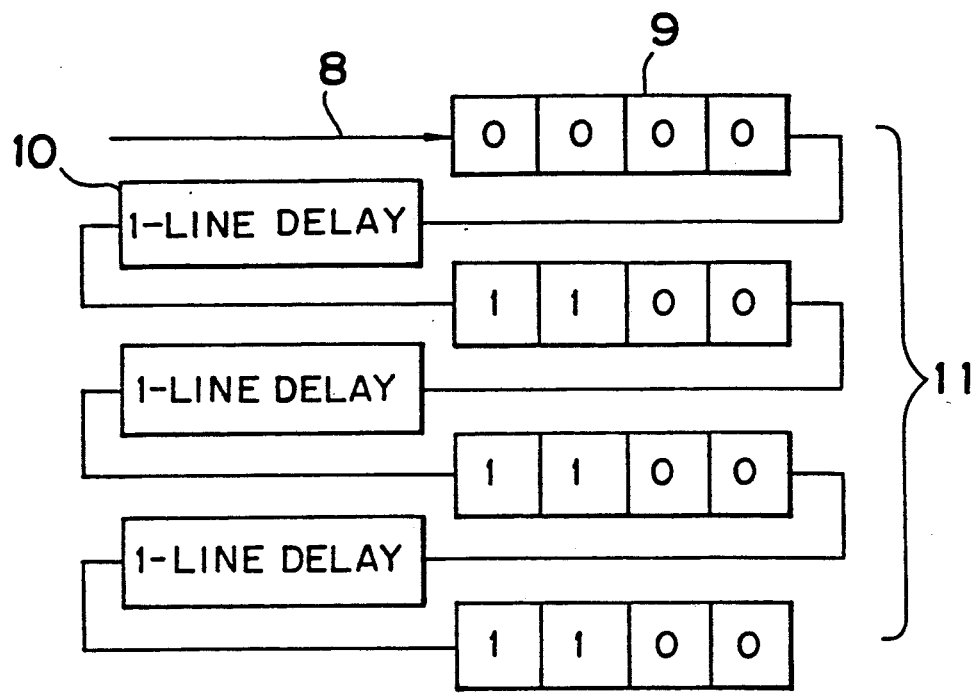
FIGS. 2a and 2b are schematic views indicative of image data and reference pattern data to be compared with each other, respectively.
Figure 2B:
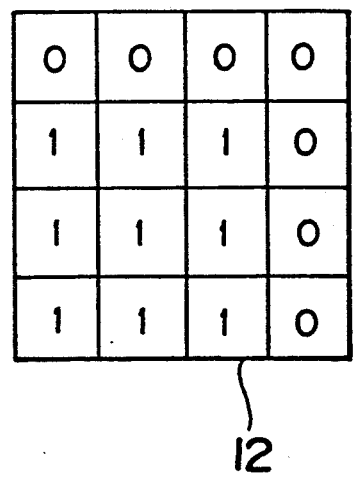
Figure 3:
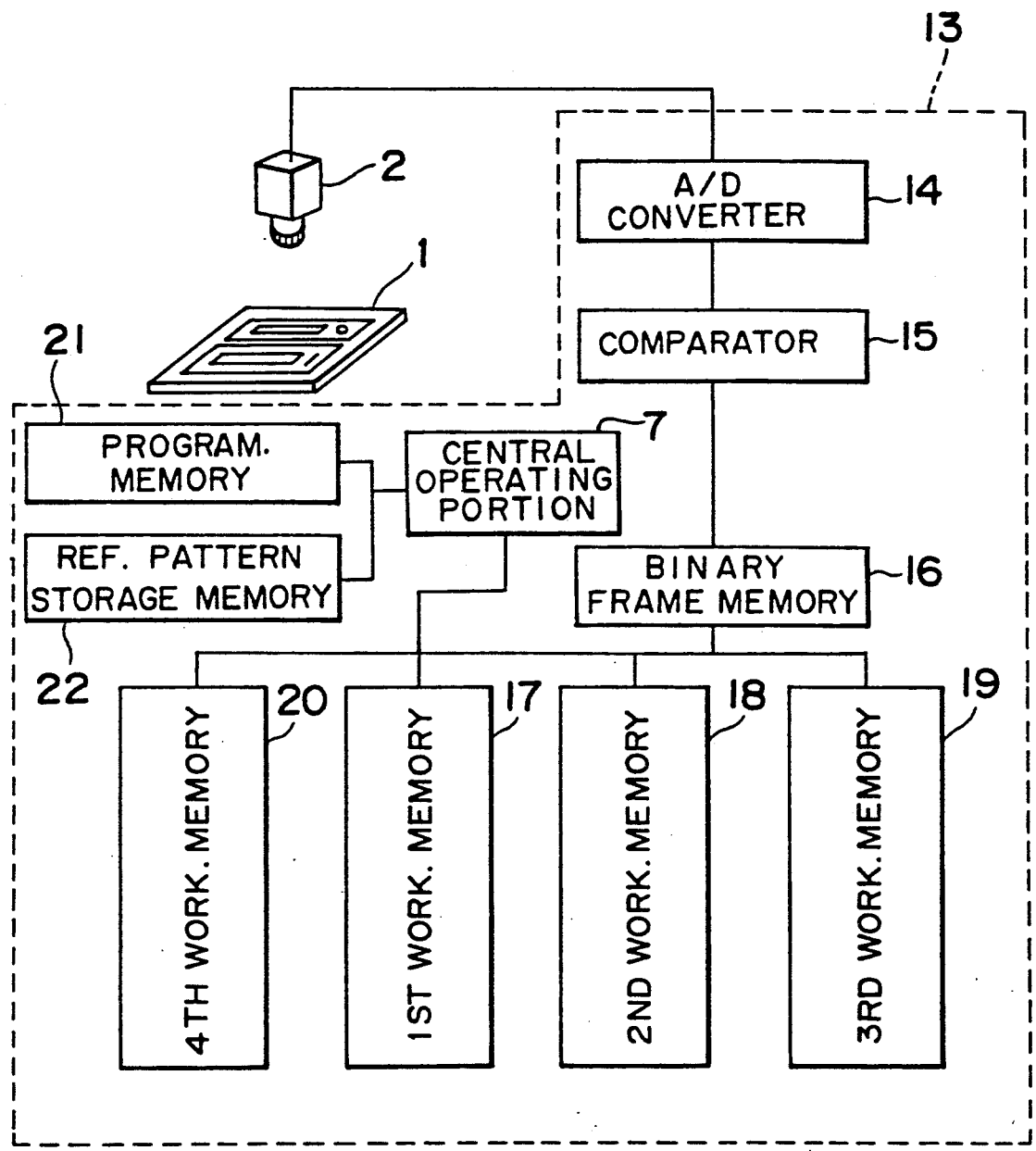
FIG. 3 is a block diagram of a pattern detector according to one preferred embodiment of the present invention.

Referring now to the drawings, there is shown in FIG. 3 a block diagram of a pattern detector embodying the present invention. The pattern detector comprises a camera 2 for conducting image pick-up with respect to a reference mark formed, for example, on a circuit board 1 and an image processing unit 13 for processing an analog image signal sent from the camera 2. The image processing unit 13 includes an A/D converter 14 for converting an analog image signal to a digital image signal, a comparator 15 for converting inputted data into binary image data "1" or "0" with a predetermined threshold value as the border, and a binary frame memory 16 for storing the binary image data outputted from the comparator 15. The image processing unit 13 further includes a plurality of working memories 17-20, a central operating portion 7, a programming memory 21 for determining processings to be performed in the central operating portion 7, and a reference pattern storage memory 22 for storing pattern data of reference patterns. Of the plurality of working memories 17-20, first, second, third and fourth working memories 17, 18, 19 and 20 store contour-line data of the image data, angular data of contour lines, angular difference data of the contour lines, and degree-of-coincidence data of the contour lines, respectively.

Figure 4:
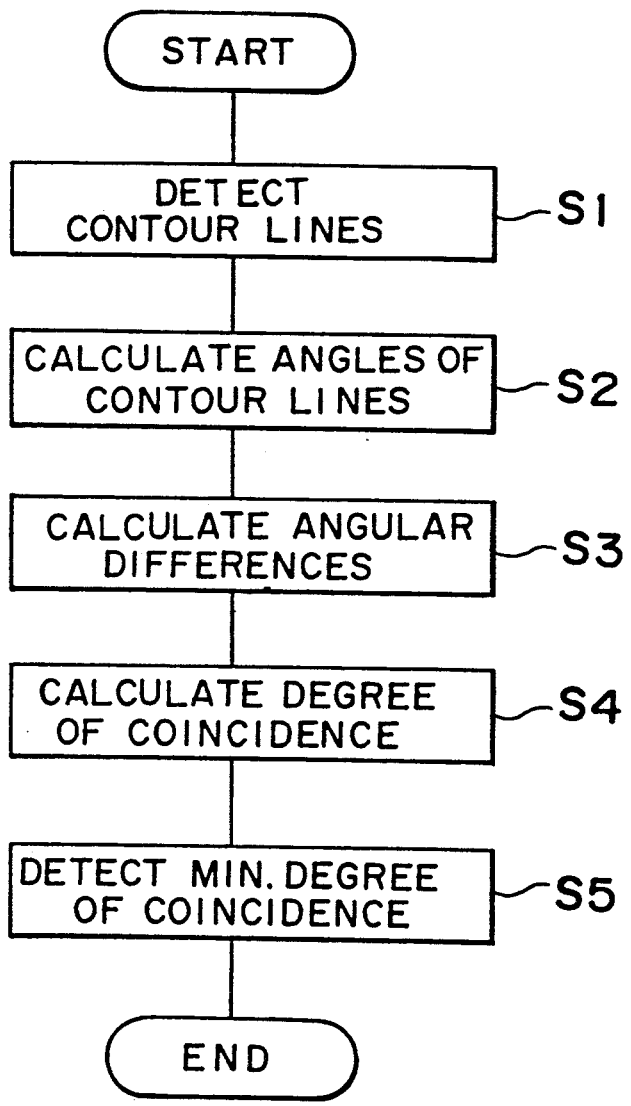
FIG. 4 is a flow-chart indicative of the operation of a central processing unit provided in the pattern detector of FIG. 3.

The operation of the pattern detector shown in FIG. 3 will be discussed hereinafter with reference to a flow-chart of FIG. 4. This flow-chart indicates a flow of processings in the central operating portion 7.

Initially, image pick-up is conducted by the camera with respect to a reference mark formed on the circuit board 1. An analog image signal outputted from the camera 2 is inputted into the image processing unit 13 and is converted into a digital image signal by the A/D converter 14. The digital image signal is then compared with the predetermined threshold value in the comparator 15 and is converted into binary image data, which are stored in the binary frame memory 16.

The central operating portion 7 operates as follows in accordance with a program stored in the programming memory 21.

Referring to the binary image data stored in the binary frame memory 16, the central operating portion 7 detects all contour lines of the image. Coordinates of a plurality of locations substantially equally spaced on the contour lines are then successively stored in the first working memory 17 (step S1).

Thereafter, angles of tangent lines of all the detected contour lines with respect to the horizontal line at the above locations are calculated and stored in the second working memory 18 (step S2). These angles are hereinafter referred to as contour-line angles. Angular changes or differences between two adjoining contour-line angles are then calculated and stored in the third working memory 19. These angular differences are hereinafter referred to as contour-line angular difference data. The contour-line data and the contour-line angular difference data obtained at steps S2 and S3 are data specifying the image of the reference mark. In the above processings, two-dimensional image data are converted into linear (one-dimensional) image data without directly using the binary image data. As a result, the amount of data is gradually reduced.

The central operating portion 7 compares the contour-line angular difference data of the target image with those of the reference pattern stored in advance in the reference pattern storage memory 22, thereby determining the degree of coincidence. The comparison by the central operating portion 7 is repeated while each of the above locations on the contour lines of the target image is employed as a starting point of the comparison in order (step S4). The degree of coincidence is stored in the fourth working memory 20.

It is to be noted that the smaller figure in the degree of coincidence represents better coincidence. Therefore, when the degree of coincidence indicates the minimum value, it is considered that the reference mark formed on the circuit board 1 coincides with the reference pattern stored in the reference pattern storage memory 22 (step S5).

The definition of the degree of coincidence will be explained hereinafter with reference to FIGS. 5a and 5b and FIG. 6.

FIGS. 5a and 5b schematically indicates examples of a contour image of a target mark to be detected and that of a reference pattern, respectively. These images are constituted by a plurality of pixels. FIG. 6 indicates a row of contourline angular difference data of the former, those of the latter, and the degree of coincidence obtained from these data.

As shown in FIGS. 5a and 5b, the target mark has equally spaced seventeen pixels on contour lines thereof where the contour-line angular differences are calculated between two adjoining pixels whereas the reference pattern has equally spaced eight pixels on contour lines thereof. These pixels have respective angular data indicative of angles of tangent lines thereof with respect to the horizontal line. Since differences between two adjoining angular data represent the contour-line angular difference data, the target mark of FIG. 5a and the reference pattern of FIG. 5b have sixteen and seven contour-line angular difference data, respectively.

Calculation in the degree of coincidence is initiated with the first angular difference data of the target mark as a starting point. More specifically, the first seven angular difference data of the target mark are initially compared with the angular difference data of the reference pattern, respectively, for calculation of the degree of coincidence. Thereafter, the calculation is successively conducted while the starting point is shifted one by one. The degree of coincidence is defined as the sum of the square of differences between the corresponding two angular difference data.

In the case of FIG. 6, seven angular difference data from the third data, shown by (a), to the ninth data of the target mark are compared with the angular difference data of the reference pattern. In this case, the degree of coincidence is 32,400. In this way, a plurality of calculation results can be obtained. Finally, the minimum figure is selected from among these calculation results. The contour-line data having coordinates corresponding to the minimum figure are considered to be a pattern closest to the reference pattern.

In the case of FIG. 6, since the figure indicative of the degree of coincidence is relatively large, it is considered that the degree of coincidence is not good. However, when the fourth data, shown by (b), of the angular difference data is employed as the starting point for calculation of the degree of coincidence, the degree of coincidence becomes zero (minimum value). As a result, it is known that the angular difference data of the target mark from the fourth data to the tenth data are just the same as those of the reference pattern.

As is clear from the above, the detection of contour lines, calculation of the contour-line angles, calculation of the contour-line angular differences, calculation of the degree of coincidence and pattern detection are conducted in the central operating portion and by the software processings. As a result, a flexible algorithm can be formulated by minimized hardware.

Since the degree of coincidence is calculated as the sum of the square of differences between angular difference data of a reference pattern and those of a target mark, the detection of that portion of the target mark that has the highest degree of coincidence with the reference pattern is considerably reliable.

Furthermore, it is unlikely that the pattern detector according to the present invention is influenced by rotation or inclination of a target object to be detected. In addition, the pattern detector according to the present invention is advantageous in that the capacity for storing pattern data can be reduced.

Although the present invention has been fully described by way of examples with reference to the accompanying drawings, it is to be noted here that various changes and modifications will be apparent to those skilled in the art. Therefore, unless such changes and modifications otherwise depart from the spirit and scope of the present invention, they should be construed as being included therein.

What is claimed is:

1. A pattern detector for detecting a reference mark formed on an object using a reference pattern stored in advance therein, said pattern detector comprising:
   image pick-up means for producing image data from the reference mark;
   means for converting said image data into digital data in binary form;
   means for detecting contour lines of the reference mark in binary form;
   means for calculating angles of tangent lines with respect to a horizontal line at a plurality of locations on said contour lines;
   means for calculating angular changes between said angles of said tangent lines at two adjoining locations; and
   means for comparing a row of said angular changes of the reference mark with a row of corresponding angular changes of the reference pattern,
   whereby that portion of said row of angular changes of the reference mark that has greatest similarity to said row of angular changes of the reference pattern is selected as being coincident with the reference pattern.

2. The pattern detector according to claim 1, wherein said means for comparing said row of angular changes of the reference mark with those of the reference pattern comprises means for calculating a sum of a square of respective differences between said angular changes of the reference mark and those of the reference pattern.

* * * * *